(12) United States Patent
Hu et al.

(10) Patent No.: US 11,121,045 B2
(45) Date of Patent: Sep. 14, 2021

(54) METHOD FOR DETECTING ULTRA-SMALL DEFECT ON WAFER SURFACE

(71) Applicant: Shanghai Huali Microelectronics Corporation, Shanghai (CN)

(72) Inventors: Xianghua Hu, Shanghai (CN); Gaoyu Wang, Shanghai (CN); Guangzhi He, Shanghai (CN); Xiaofang Gu, Shanghai (CN); Qiliang Ni, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 16/691,180

(22) Filed: Nov. 21, 2019

(65) Prior Publication Data

US 2021/0057289 A1   Feb. 25, 2021

(30) Foreign Application Priority Data

Aug. 19, 2019   (CN) .......................... 201910762878.1

(51) Int. Cl.
| | | |
|---|---|---|
| *G01R 31/26* | (2020.01) | |
| *H01L 21/66* | (2006.01) | |
| *H01L 21/02* | (2006.01) | |
| *H01L 21/311* | (2006.01) | |

(52) U.S. Cl.
CPC .......... *H01L 22/12* (2013.01); *H01L 21/0206* (2013.01); *H01L 21/31144* (2013.01)

(58) Field of Classification Search
CPC ................. H01L 22/12; H01L 21/0206; H01L 21/31144; H01L 21/67288; G01R 31/2831
USPC ......................................................... 438/14
See application file for complete search history.

(56) References Cited

U.S. PATENT DOCUMENTS

| | | | | |
|---|---|---|---|---|
| 2002/0006497 A1* | 1/2002 | Noda | ....................... | H01L 22/34 428/156 |
| 2002/0093648 A1 | 7/2002 | Nikoonahad et al. | | |
| 2013/0210233 A1 | 8/2013 | Cheng et al. | | |
| 2018/0082940 A1* | 3/2018 | Sorensen | ............ | H01L 23/5226 |
| 2019/0113851 A1* | 4/2019 | Liao | .................... | G03F 7/70475 |

FOREIGN PATENT DOCUMENTS

| | | |
|---|---|---|
| CN | 100353514 C | 12/2007 |
| CN | 102044432 A | 5/2011 |
| CN | 102237270 A | 11/2011 |
| CN | 102539448 A | 7/2012 |
| CN | 102830594 A | 12/2012 |
| CN | 102881609 A | 1/2013 |
| CN | 103632992 A | 3/2014 |
| CN | 102830594 B | 2/2015 |
| CN | 104716066 A | 6/2015 |
| CN | 104851820 A | 8/2015 |
| CN | 106292180 A | 1/2017 |
| CN | 106502055 A | 3/2017 |
| JP | 2003243290 A | 8/2003 |
| JP | 2007242862 A | 9/2007 |

OTHER PUBLICATIONS

Mar. 3, 2021—(CN) CNIPA First Search Report Appn 201910762878.1.

* cited by examiner

*Primary Examiner* — Calvin Y Choi
(74) *Attorney, Agent, or Firm* — Banner & Witcoff, Ltd.

(57) ABSTRACT

The present invention provides a method for detecting an ultra-small defect on a wafer surface, film layer having ultra-small defect that causes abnormalities on the surface of the film layer; form a photoresist pattern with a pattern defect; etching the film layer according to the photoresist pattern to form a film layer pattern with an enlarged defect; and scanning the film layer pattern by using a defect scanner to capture the enlarged defect. In this method, enlarging the size of the ultra-fine particle defect through the exposure defocusing principle; or by adding the photomask consisting of the repeating units, using the repetition pattern as the exposure pattern and combing with the repeating cell to cell comparison method, the capture ability of the detection machine is further improved. Therefore, it can be detected by amplifying the defects of ultrafine particles which cannot be detected by conventional methods.

11 Claims, 6 Drawing Sheets

METHOD FOR DETECTING ULTRA-SMALL DEFECT ON WAFER SURFACE

CROSS REFERENCE TO RELATED APPLICATIONS

The present application claims priority to and the benefit of Chinese Patent Application No. 201910762878.1 filed on Aug. 19, 2019, the disclosure of which is incorporated herein by reference in its entirety as part of the present application.

BACKGROUND

The present invention relates to the field of semiconductor manufacturing, in particular to a method for detecting an ultra-small defect on a wafer surface.

DESCRIPTION OF RELATED ART

With the continuous decrease of chip manufacturing technology nodes, defect detection is a very critical link. At present, the mainstream defect detection equipment in the industry is divided into dark field scanning, bright field scanning, electronic scanning, etc.; these detection machines are also constantly updated, and constantly enhance their ability to detect defects, from micrometer level to nanometer level. The wafer manufacturing industry also uses a variety of detection tools to find out all the defects that have an impact on yield, but there are always critical points in the detection machines. Some ultra-fine particle defects are still hard to be captured by the existing defect detection machines. At present, SIN/oxide films have been deposited to increase the size of defects, and good results have been achieved, but for the ultra-small defect, it requires thicker film deposition to grow to a sufficiently large size, resulting in cost increase. At the same time, since the deposited film is thick, the defects are easy to be buried in the film to form a relatively flat buried PD, which reduces the signal strength of the defect scanning machines and makes it difficult for the machines to capture the defects.

Therefore, it is necessary to provide a new method to improve the ability in capturing ultra-fine particles.

BRIEF SUMMARY

In view of the above defects of the prior art, the purpose of the present invention is to provide a method for detecting an ultra-small defect on a wafer surface, which is used for solving the problem that it is very difficult for the existing defect detection machines to capture ultra-small particle defects in the prior art.

In order to realize the above purpose and other related purposes, the present invention provides a method for detecting an ultra-small defect on a wafer surface. The method at least comprises the following steps: step 1: providing a substrate with a film layer on the surface, the upper surface of the film layer having an ultra-small defect that cause abnormalities on the surface of the film layer; step 2: forming a photoresist layer on the upper surface of the film layer, and then exposing and developing the photoresist layer to form a photoresist pattern with a pattern defect; step 3: etching the film layer according to the photoresist pattern to form a film layer pattern with an enlarged defect; and step 4: scanning the film layer pattern by using a defect scanner to capture the enlarged defect.

Preferably, in step 1, the size of the ultra-small defect is 0.01 μm-0.2 μm.

Preferably, in step 2, the photoresist layer is exposed to form the enlarged pattern defect through a development defocusing principle.

Preferably, in step 2, the photoresist layer is exposed by using a photomask pattern consisting of repeating units.

Preferably, the repeating units in the photomask used in exposure comprise a plurality of strip-shaped patterns with the same width and spacing.

Preferably, in step 2, the photoresist layer formed on the upper surface of the film layer is positive photoresist.

Preferably, in step 2, the photoresist layer formed on the upper surface of the film layer is negative photoresist.

Preferably, step 3 further comprises removing the residual photoresist on the surface of the film layer after etching the film layer.

Preferably, a method for removing the residual photoresist on the surface of the film layer is wet removal.

Preferably, a method for removing the residual photoresist on the surface of the film layer is dry removal.

Preferably, the size of the enlarged defect is three times the size of the ultra-small defect.

As described above, the method for detecting an ultra-small defect on a wafer surface provided by the present invention has the following beneficial effects: by using the existing defect detection machine, coating photoresist on the surface of the conventional wafer and enlarging the size of the ultra-fine particle defect through the exposure defocusing principle, the defect detection machine can effectively capture the defect; or by adding the photomask consisting of the repeating units, using the repetition pattern as the exposure pattern and combing with the repeating cell to cell comparison method of the current optical defect detection machine, the capture ability of the detection machine is further improved. Therefore, it is possible to detect by enlarging the ultra-fine particle defect which cannot be detected normally.

DETAILED DESCRIPTION

The embodiments of the present invention will be described below through specific examples, and one skilled in the art can easily understand other advantages and effects of the present invention according to the contents disclosed in the description. The present invention may also be implemented or applied by means of other different specific embodiments, and the details in the description may also be modified or changed without departing from the spirit of the present invention based on different viewpoints and applications.

Please refer to FIG. 1 to FIG. 8b. It should be noted that the drawings provided in the embodiments are only used for schematically describing the basic concept of the present invention, only illustrate the components related to the present invention, and are not drawn according to the number, shape and size of the components during actual implementation. The configuration, number and scale of each component during actual implementation may be freely changed, and the layout configuration of the component may be more complex.

Embodiment 1

Figure 1:
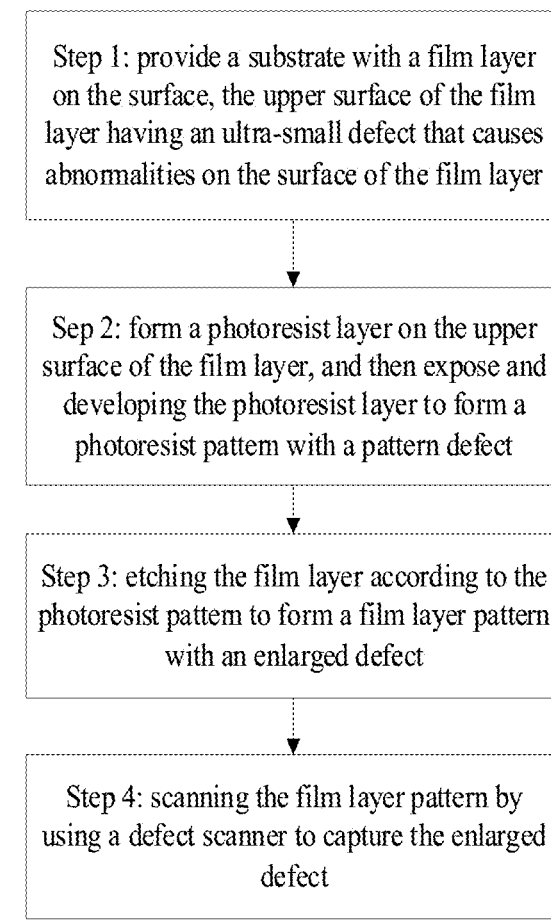
FIG. 1 illustrates a flowchart of a method for detecting an ultra-small defect on a wafer surface according to the present invention.
Figure 2:
FIG. 2 illustrates a structural schematic view of a substrate with a film layer according to the present invention.
Figure 3:
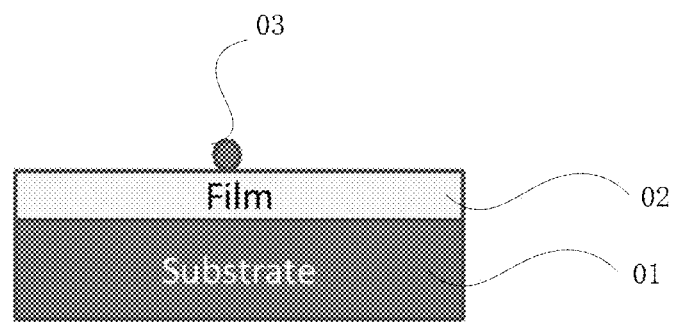
FIG. 3 illustrates a structural schematic view of a film layer with an ultra-small defect according to the present invention.

The present invention provides a method for detecting an ultra-small defect on a wafer surface. As illustrated in FIG. 1, it illustrates a flowchart of the method for detecting an ultra-small defect on a wafer surface according to the present invention. The method at least comprises the following steps:

In step 1, a substrate with a film layer on the surface is provided. As illustrated in FIG. 2, it illustrates a structural schematic view of a substrate with a film layer according to the present invention. The upper surface of the substrate 01 is provided with a film layer 02. The upper surface of the film layer 02 has an ultra-small defect that causes abnormalities on the surface of the film layer 02. As illustrated in FIG. 3, it illustrates a structural schematic view of the film layer with an ultra-small defect according to the present invention. The ultra-small defect 03 is located on the upper surface of the film layer 02.

Further, in step 1, the size of the ultra-small defect 03 is 0.01 μm-0.2 μm. Defects within this size range are sufficient to cause abnormalities on the upper surface of the film layer.

Figure 4:
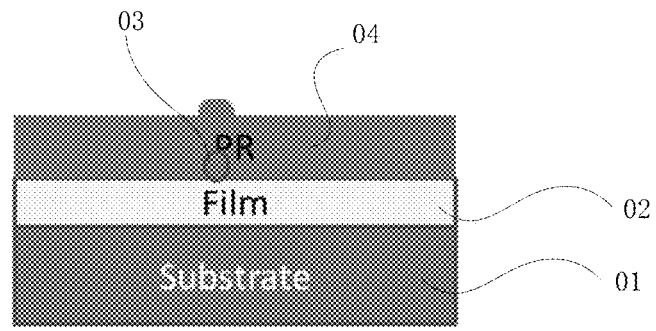
FIG. 4 illustrates a structural schematic view of a film layer on which a photoresist layer is formed according to the present invention.

In step 2, a photoresist layer is formed on the upper surface of the film layer. As illustrated in FIG. 4, it illustrates a structural schematic view of a film layer on which a photoresist layer is formed according to the present invention, The upper surface of the film layer 02 has an ultra-small defect 03, and the photoresist layer 04 is formed on the upper surface of the film layer 02 and covers the ultra-small defect 03.

Figure 5A:
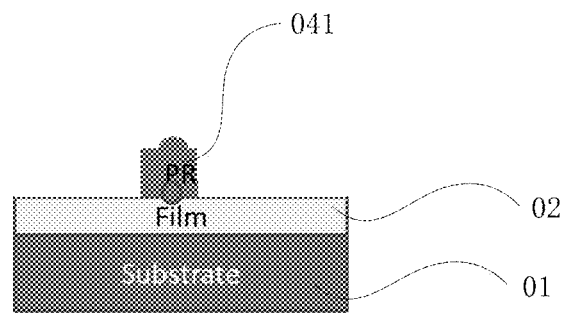
FIG. 5a illustrates a schematic view of exposure and development of a photoresist layer in embodiment 1 of the present invention.

As illustrated in FIG. 5a, it illustrates a schematic view of exposure and development of a photoresist layer in embodiment 1 of the present invention. This step further comprises exposing and developing the photoresist layer 04 after forming the photoresist layer 04 to form a photoresist pattern 041 with a pattern defect. Further, in step 2, the photoresist layer is exposed to form the enlarged pattern defect through a development defocusing principle. That is to say, the defect is directly enlarged by adopting the development defocusing principle. It also means that the size of the ultra-fine particle defect will increase, which will make the defect detection machine effectively catch the defect.

In this step, after the photoresist layer is exposed and developed, a photoresist pattern 041 is formed, and the ultra-small defect 03 causes the development defocusing of the part of the photoresist in the region above. That is to say, the existence of the ultra-small defect 03 causes the defocusing of the part of the photoresist in the region above during exposure and development. Preferably, in step 2, the photoresist layer formed on the upper surface of the film layer 02 is positive photoresist. That is to say, the photoresist used to form the photoresist layer in the present embodiment is positive photoresist. After exposed and developed, the exposed part of the positive photoresist can be dissolved in a developer. The other photoresist is negative photoresist. After exposed and developed, the exposed part of the negative photoresist cannot be dissolved in the developer. Therefore, the photoresist patterns formed after development of the two types of photoresist are opposite.

Figure 5B:
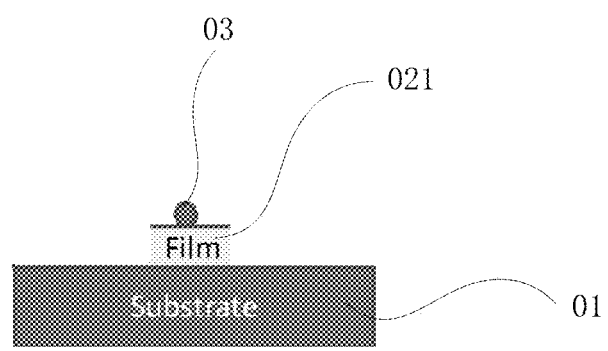
FIG. 5b illustrates a schematic view of a film layer after etching in embodiment 1 of the present invention.

In step 3, the film layer is etched according to the photoresist pattern to form a film layer pattern with an enlarged defect. As illustrated in FIG. 5b, the film layer is etched. Since the photoresist above the ultra-small defect 03 is defocused, when the photoresist pattern is transferred to the film layer 02, the pattern of the defocused part is also transferred to the film layer 02. Therefore, a film layer pattern 021 is formed, the size of the ultra-fine particle defect is enlarged and thus the defect detection machine can effectively catch the defect.

Further, step 3 further comprises removing the residual photoresist on the surface of the film layer after the film layer is etched. Since the etching of the film layer to form the film layer pattern is carried out according to the photoresist pattern, there is still photoresist on the part of the film layer that has not been etched after etching. Therefore, the photoresist on the film layer pattern needs to be removed. Further, a method for removing the residual photoresist on the surface of the film layer is wet removal. In other words, the residual photoresist is removed by wet cleaning.

Figure 7:
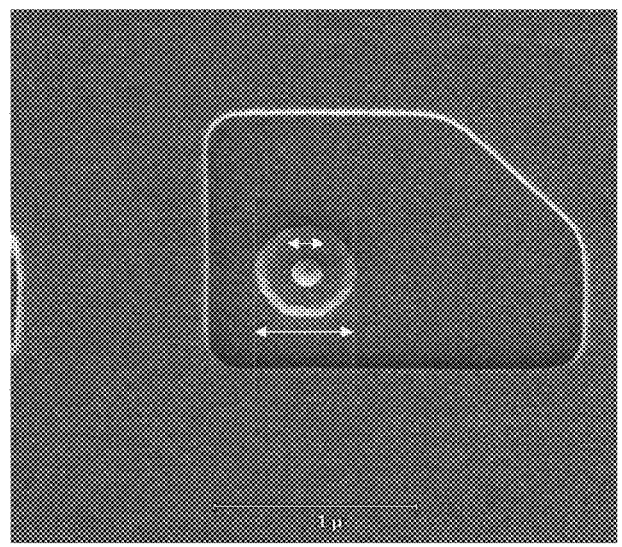
FIG. 7 illustrates an electronic display picture of an enlarged defect captured by using a scanning detection machine in the present invention.

In step 4, the film layer pattern is scanned by using a defect scanner to capture the enlarged defect. As illustrated in FIG. 7, it illustrates an electronic display picture of an enlarged defect captured by using a scanning detection machine in the present invention. The light signal of the ultra-small defect displayed in the defect scanner is weak. When the photoresist development defocusing is adopted, the signal becomes strong after the size of the defect is enlarged, and the size of the enlarged defect is three times the size of the ultra-small defect.

Figure 8A:
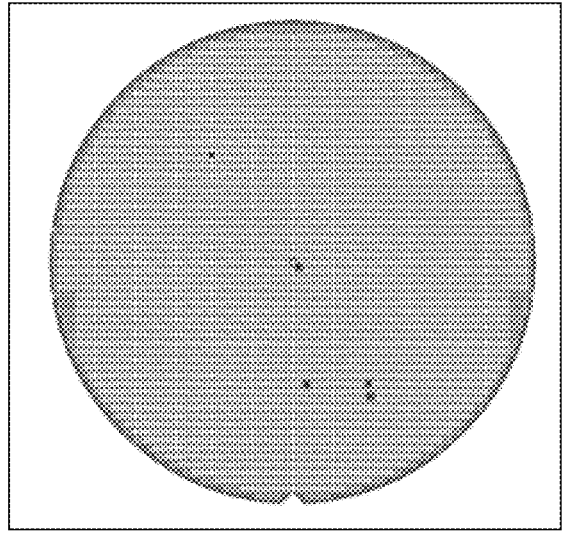
FIG. 8a illustrates defects on a wafer surface captured by a scanning detection machine in the prior art.
Figure 8B:
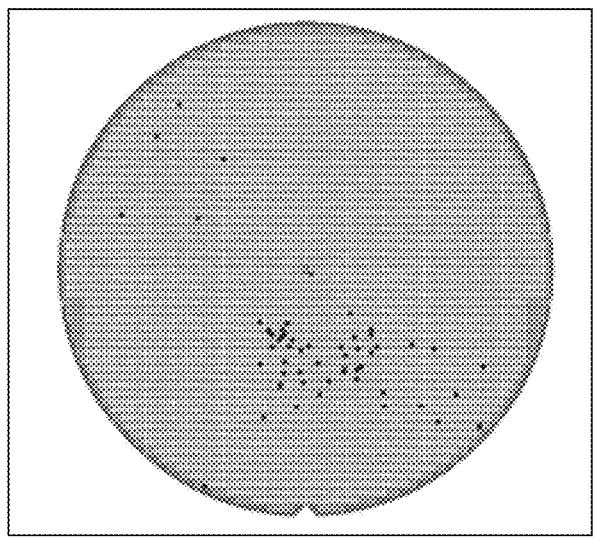
FIG. 8b illustrates defects on a wafer surface captured by a scanning detection machine after the method for detecting an ultra-small defect on a wafer surface provided by the present invention is adopted.

As illustrated in FIG. 8a and FIG. 8b, FIG. 8A illustrates defects on a wafer surface captured by a scanning detection machine in the prior art; FIG. 8b illustrates defects on a wafer surface captured by a scanning detection machine after the method for detecting an ultra-small defect on a wafer surface provided by the present invention is adopted. Upon comparison, it can be seen that more ultra-small defects can be detected by the detection method provided by the present invention, and the detection ability is obviously improved without replacing the existing machine.

Embodiment 2

Figure 6A:
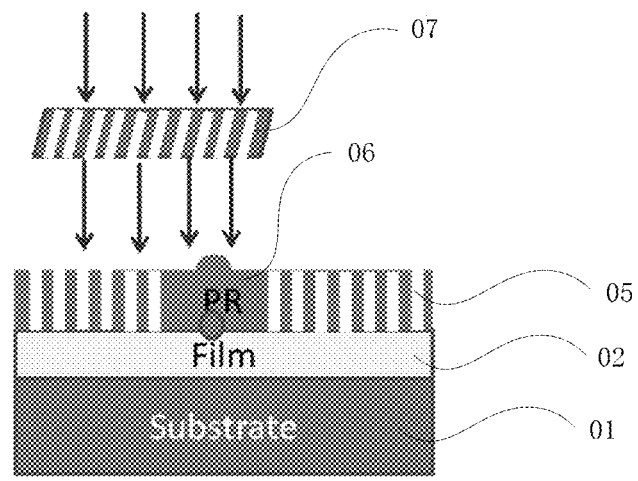
FIG. 6a illustrates a schematic view of exposure and development of a photoresist layer in embodiment 2 of the present invention.

The difference between the present embodiment and embodiment 1 is that, in step 2, the photoresist layer is exposed by using a photomask pattern consisting of repeating units. Moreover, the repeating units in the photomask used in exposure comprise a plurality of strip-shaped patterns with the same width and spacing. As illustrated in FIG. 6a, the pattern on the photomask 07 consists of a plurality of strip-shaped structures arranged horizontally, and the size and shape of the plurality of strip-shaped structures in the present embodiment are the same, that is, the length and width of the plurality of strip-shaped structures and the distance between the adjacent two strip-shaped structures are the same. Further, the photomask pattern is divided into a plurality of units, each of which comprises a plurality of strip-shaped patterns. That is to say, the strip-shaped structures on the photomask 07 are divided into a plurality of units according to the arrangement, and the number of strip-shaped structures in each unit is the same. When the size of the defect is too small, a repeated mask may be used for exposure, and the cell to cell comparison method of the scanning machine may be used to further improve the defect capture ability.

Figure 6B:
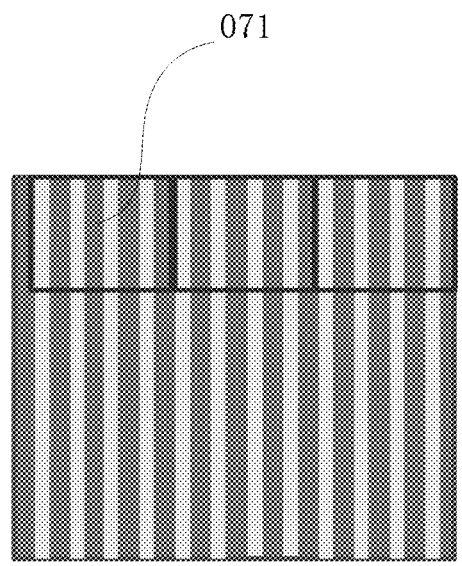
FIG. 6b illustrates a schematic view of a photomask in embodiment 2 of the present invention.

That is to say, by adding the mask consisting of the repeating units to form repeated patterns as a background, and combining with the current cell to cell comparison method of the optical defect detection machine, the capture ability of the defect detection machine can be further improved. In the present embodiment, the used photomask consisting of the repeating units is as illustrated in FIG. 6b, in which the unit 071 is arranged repeatedly, and the film layer pattern obtained after the exposure and development between the units can be compared in the defect detection machine to find out the ultra-small defect.

In FIG. 6a, it illustrates a photoresist pattern 05 obtained by exposure development of the photoresist above a position without an ultra-small defect and a photoresist pattern 06 obtained by exposure development of the photoresist above a position with an ultra-small defect.

Figure 6C:
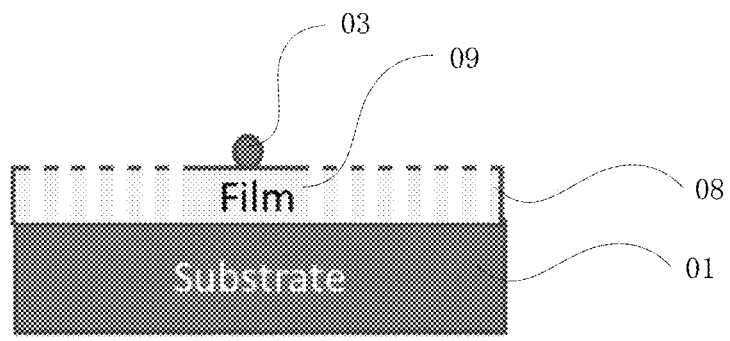
FIG. 6c illustrates a schematic view of a film layer after etching in embodiment 2 of the present invention.
Figure 6D:
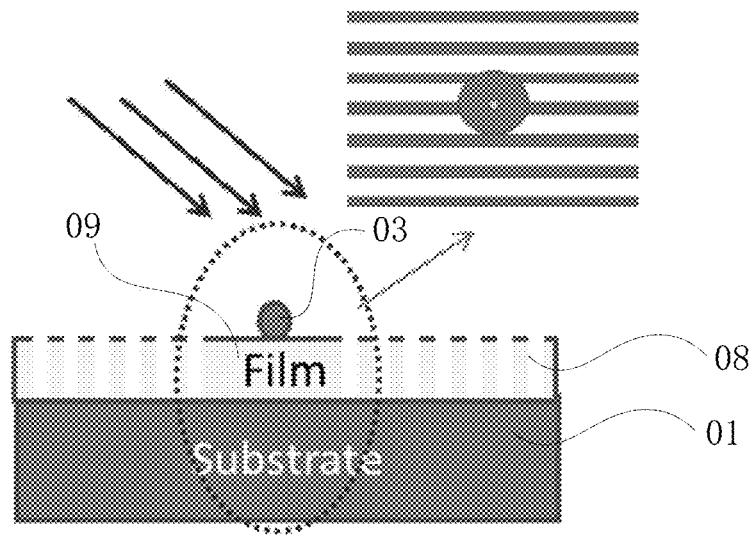
FIG. 6d illustrates a schematic view of capture of an enlarged defect by using a scanning detection machine in embodiment 2 of the present invention.

In step 3 of the present embodiment, the film layer 02 is etched according to the above photoresist pattern 05 and photoresist pattern 06. The obtained film layer pattern is as illustrated in FIG. 6c. The difference between the film layer pattern 09 below the ultra-small defect and the film layer pattern 08 not influenced by the ultra-small defect can be found through the detection and comparison by the defect detection machine. The film layer pattern 09 in the dotted line box of FIG. 6d will be detected by the defect detection machine by comparing with the film layer pattern 08 due to the influence of the ultra-small defect, so as to detect the existence of the ultra-small defect 03.

The difference between the present embodiment and embodiment 1 is that, in the present embodiment, the method for removing the residual photoresist on the surface of the film layer is dry removal, that is to say, step 3 further comprises removing the residual photoresist on the surface of the film layer after the film layer is removed. Since the etching of the film layer to form the film layer pattern is carried out according to the photoresist pattern, there is still photoresist on the part of the film layer that has not been etched after etching, so it is necessary to remove the photoresist on the film layer pattern. Further, the method for removing the residual photoresist on the surface of the film layer is dry removal.

In addition, the difference between the present embodiment and embodiment 1 is that, in step 2, the photoresist layer formed on the upper surface of the film layer is negative photoresist. That is to say, the photoresist used to form the photoresist layer in the present embodiment is negative photoresist. After exposed and developed, the exposed part of the negative photoresist cannot be dissolved in a developer, while in embodiment 1, the positive photoresist is used. After exposed and developed, the exposed part of the positive photoresist can be dissolved in a developer. Therefore, the photoresist patterns formed after development of the two types of photoresist is opposite.

To sum up, by using the defect detection machine, coating photoresist on the surface of the conventional wafer and enlarging the size of the ultra-fine particle defect through the exposure defocusing principle, the defect detection machine can effectively capture the defect; or by adding the photomask consisting of the repeating units, using the repetition pattern as the exposure pattern and combing with the repeating cell to cell comparison method of the current optical defect detection machine, the capture ability of the detection machine is further improved. Therefore, it is possible to detect by enlarging the ultra-fine particle defect which cannot be detected normally. Therefore, the present invention overcomes various disadvantages in the prior art and has a great industrial utilization value.

The above embodiments are only used for exemplarily describing the principle and effects of the present invention instead of limiting the present invention. One skilled in the art may modify or change the above embodiments without departing from the spirit and scope of the present invention. Therefore, all equivalent modifications or changes made by one skilled in the art without departing from the spirit and technical concept disclosed by the present invention shall be covered by the claims of the present invention.

What is claimed is:

1. A method for detecting an ultra-small defect on a wafer surface, wherein the method at least comprises the following steps:
   step 1: providing a substrate with a film layer on the surface, the upper surface of the film layer having an ultra-small defect that causes abnormalities on the surface of the film layer;
   step 2: forming a photoresist layer on the upper surface of the film layer, and then exposing and developing the photoresist layer to form a photoresist pattern with a pattern defect;
   step 3: etching the film layer according to the photoresist pattern to form a film layer pattern with an enlarged defect; and
   step 4: scanning the film layer pattern by using a defect scanner to capture the enlarged defect.

2. The method for detecting an ultra-small defect on a wafer surface according to claim 1, wherein in step 1, the size of the ultra-small defect is 0.01 μm-0.2 μm.

3. The method for detecting an ultra-small defect on a wafer surface according to claim 1, wherein in step 2, the photoresist layer is exposed to form the enlarged pattern defect through a development defocusing principle.

4. The method for detecting an ultra-small defect on a wafer surface according to claim 1, wherein in step 2, the photoresist layer is exposed by using a photomask pattern consisting of repeating units.

5. The method for detecting an ultra-small defect on a wafer surface according to claim 4, wherein the repeating units in the photomask used in exposure comprise a plurality of strip-shaped patterns with the same width and spacing.

6. The method for detecting an ultra-small defect on a wafer surface according to claim 1, wherein in step 2, the photoresist layer formed on the upper surface of the film layer is positive photoresist.

7. The method for detecting an ultra-small defect on a wafer surface according to claim 1, wherein in step 2, the photoresist layer formed on the upper surface of the film layer is negative photoresist.

8. The method for detecting an ultra-small defect on a wafer surface according to claim 1, wherein step 3 further comprises removing the residual photoresist on the surface of the film layer after etching the film layer.

9. The method for detecting an ultra-small defect on a wafer surface according to claim 8, wherein a method for removing the residual photoresist on the surface of the film layer is wet removal.

10. The method for detecting an ultra-small defect on a wafer surface according to claim 8, wherein a method for removing the residual photoresist on the surface of the film layer is dry removal.

11. The method for detecting an ultra-small defect on a wafer surface according to claim 1, wherein the size of the enlarged defect is three times the size of the ultra-small defect.

\* \* \* \* \*